US008093668B2

(12) United States Patent
Ueda

(10) Patent No.: US 8,093,668 B2
(45) Date of Patent: Jan. 10, 2012

(54) MAGNETORESISTIVE RANDOM ACCESS MEMORY INCLUDING REFERENCE CELLS

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 601 days.

(21) Appl. No.: 12/138,942

(22) Filed: Jun. 13, 2008

(65) Prior Publication Data

US 2008/0315335 A1 Dec. 25, 2008

(30) Foreign Application Priority Data

Jun. 19, 2007 (JP) .................. 2007-161467

(51) Int. Cl.
*H01L 29/82* (2006.01)

(52) U.S. Cl. ........ 257/421; 257/108; 257/225; 257/414; 257/427; 257/E21.665; 257/E27.006; 365/158; 365/171; 365/173; 365/210.1; 365/225.5

(58) Field of Classification Search .................. 257/421, 257/E21.665, E27.006, E43.001, E43.004, 257/108, 225, 414, 427; 365/158, 171, 173, 365/225.5, 210.1
See application file for complete search history.

(56) References Cited

U.S. PATENT DOCUMENTS

| 5,695,864 | A | 12/1997 | Slonczewski |
| 6,885,579 | B2 * | 4/2005 | Sakimura et al. ............. 365/158 |
| 6,943,420 | B2 | 9/2005 | Jeong |
| 7,733,729 | B2 * | 6/2010 | Boeve ........................ 365/210.1 |

FOREIGN PATENT DOCUMENTS

| JP | 2003-60165 | 2/2003 |
| JP | 2006-210396 | 8/2006 |
| WO | WO 2005/096315 | * 10/2005 |

* cited by examiner

*Primary Examiner* — Jay C Kim
(74) *Attorney, Agent, or Firm* — Oblon, Spivak, McClelland, Maier & Neustadt, L.L.P.

(57) ABSTRACT

A magnetoresistive random access memory includes first and second magnetoresistive effect element. A shape of the first magnetoresistive effect element has a first length in a first direction and a second length in a second direction. The second length is equal to or greater than the first length. A ratio of the second length to the first length is a first value. The second magnetoresistive effect element is used to determine a resistance state of the first magnetoresistive effect element. A shape of the second magnetoresistive effect element has a third length in a third direction and a fourth length in a fourth direction. The fourth length is equal to or greater than the third length. A ratio of the fourth length to the third length is a second value which is greater than the first value.

7 Claims, 9 Drawing Sheets

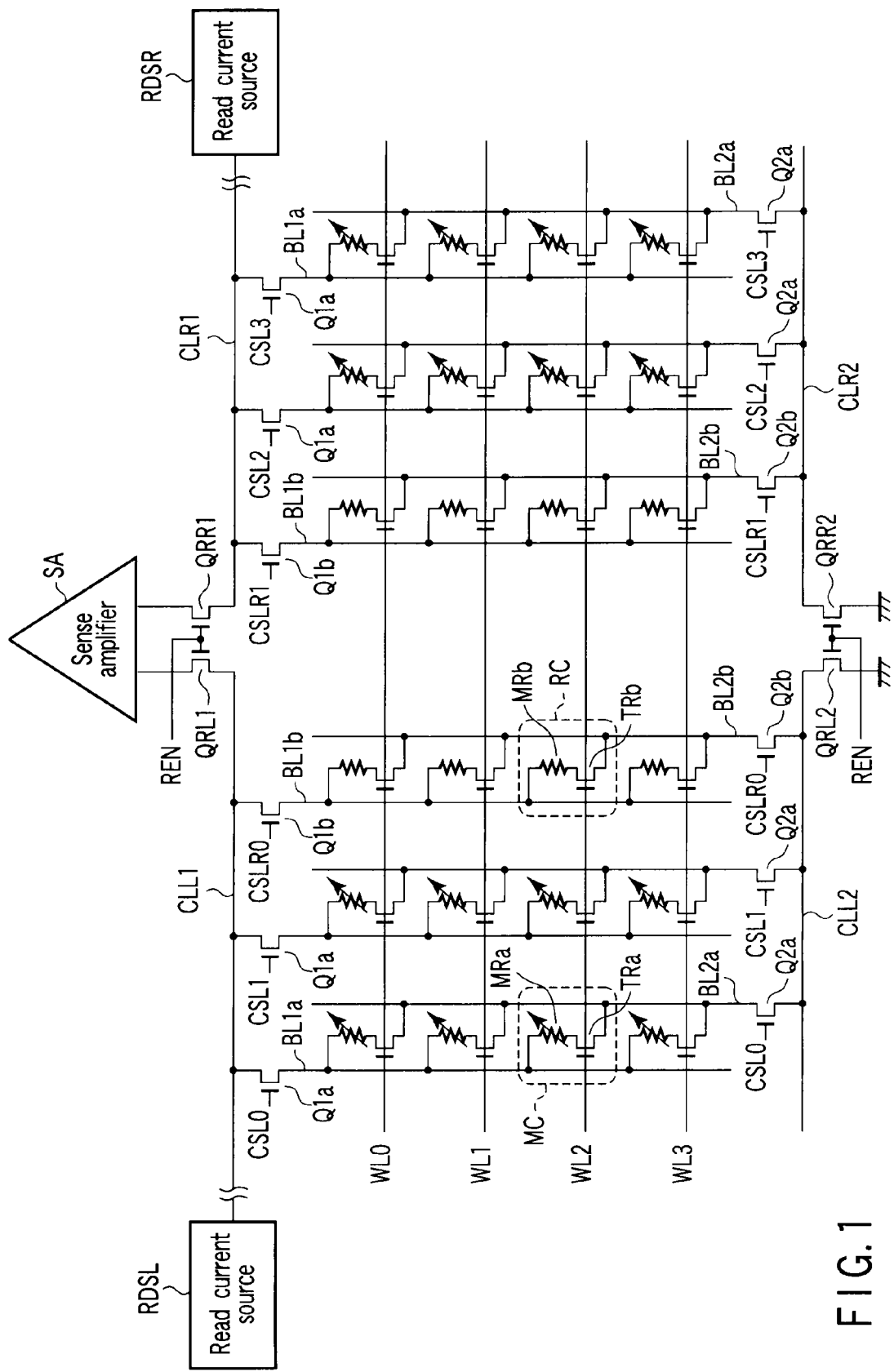
F I G. 1

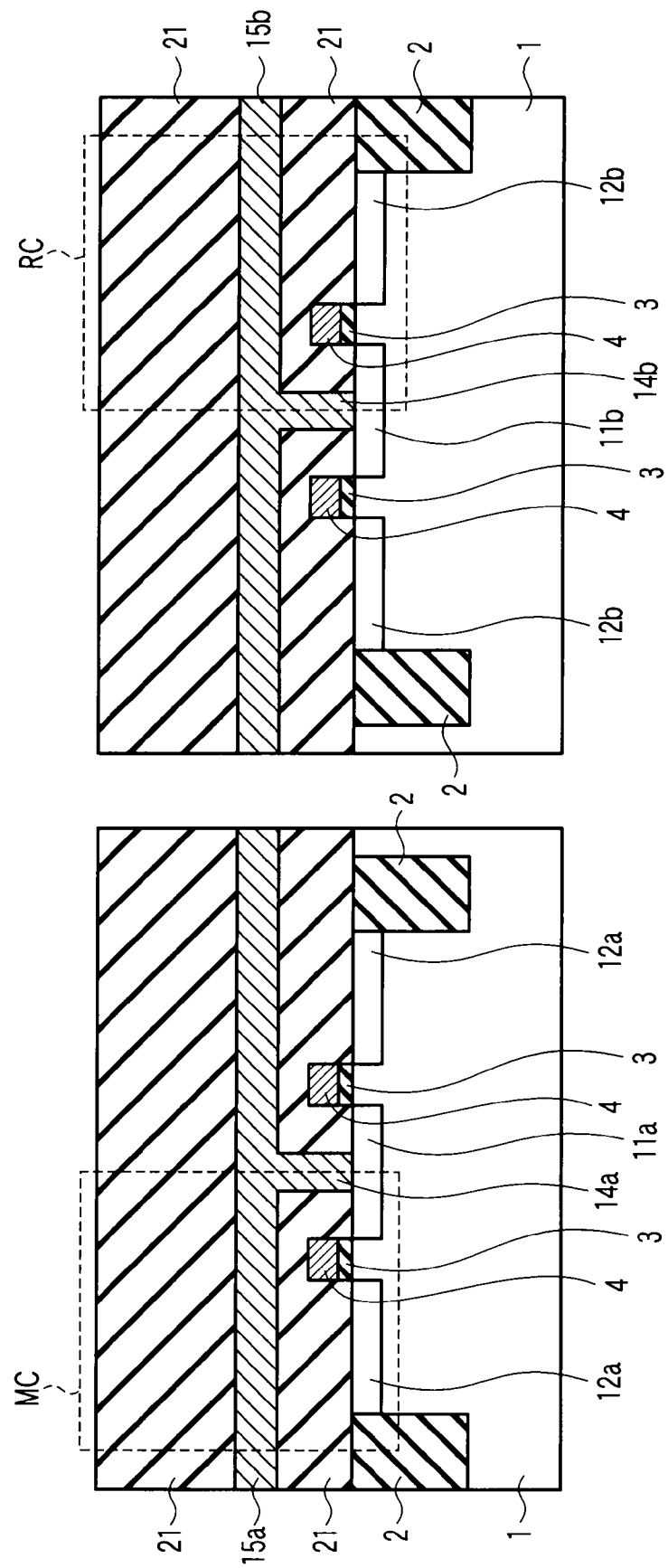

MAGNETORESISTIVE RANDOM ACCESS MEMORY INCLUDING REFERENCE CELLS

CROSS-REFERENCE TO RELATED APPLICATIONS

This application is based upon and claims the benefit of priority from prior Japanese Patent Application No. 2007-161467, filed Jun. 19, 2007, the entire contents of which are incorporated herein by reference.

BACKGROUND OF THE INVENTION

1. Field of the Invention

The present invention relates to a magnetoresistive random access memory, and relates to, for example, a reference cell of a magnetoresistive random access memory.

2. Description of the Related Art

A magnetoresistive random access memory (MRAM) makes use of a magnetoresistive effect element as a memory cell. The magnetoresistive effect element includes a free layer (recording layer) having a variable direction of magnetization, and a fixed layer having a fixed direction of magnetization. A non-magnetic layer is interposed between the free layer and the fixed layer. The magnetoresistive effect element is in a low resistance state when the direction of magnetization of the free layer is parallel to that of the fixed layer, and is in a high resistance state when the direction of magnetization of the free layer is antiparallel to that of the fixed layer. A difference in resistance state is used to record information.

Read of information is executed by causing a read current to flow through the magnetoresistive effect element, converting the resistance value of the magnetoresistive effect element to an electric current value or a voltage value, and comparing the electric current value or voltage value with a reference value. Write of information is executed by changing the direction of magnetization of the free layer of the magnetoresistive effect element by causing an electric current, which is spin-polarized by the magnetic moment of the fixed layer, to flow through the free layer. The polarity of data is controlled by the direction of the current flowing through the magnetoresistive effect element (document 1: U.S. Pat. No. 5,695,864). In this write method, compared to a method using a magnetic field, a more direct effect can be exerted on a nano-scale magnetic body. Thus, no erroneous write occurs in a neighboring memory cell, and high-speed reversal of magnetization can be expected. In addition, advantageously, the amount of electric current necessary for information write decreases as the memory size becomes smaller.

The determination of information, which is stored in the magnetoresistive effect element, is executed by comparing a cell signal, which is obtained by the magnetoresistive effect element, with a reference signal. Both the cell signal and the reference signal are current values or voltage values. In many cases, the reference signal has a value between a cell signal which is obtained by the magnetoresistive effect element that is in a high resistance state, and a cell signal which is obtained by the magnetoresistive effect element that is in a low resistance state. Various methods of generating the reference signal can be thought. For example, it is thinkable to use a reference cell. The reference cell has the same structure as the magnetoresistive effect element included in the memory cell.

Document 2 (U.S. Pat. No. 6,943,420), for instance, specifically describes a method of generating a reference signal. In document 2, four reference cells are used. The magnetoresistive effect elements of two of the four reference cells are fixed in a low resistance state, and the magnetoresistive effect elements of the other two reference cells are fixed in a high resistance state. Using these reference cells, a reference signal having a value between a cell signal at the time of the high resistance state and a cell signal at the time of the low resistance state is generated.

In addition, in document 2, the reference signal is generated by setting the direction of magnetization of the free layer of the reference cell to be perpendicular to the direction of magnetization of the fixed layer. According to this method, it is possible to realize a magnetoresistive effect element having a resistance value between a value in the high resistance and a value in the low resistance state of the magnetoresistive effect element.

In the technique of document 2, however, no consideration is given to the stability of magnetization configuration of the reference cell. As described above, the reference signal is a reference for determining the logic of the cell signal. Hence, if the reference signal is unstable due to an unstable magnetization configuration of the reference cell, the logic of the cell signal cannot correctly be determined, and the reliability of the magnetoresistive random access memory considerably deteriorates. Specifically, after the magnetization configuration of the reference cell is erroneously reversed, this reference cell becomes permanently defective.

If the reference cell is restored to the normal state by rewrite, the defect of the reference cell is eliminated. However, since the reference cell is a reference for a read operation, a mechanism for recognizing the state of the reference cell, that is, a mechanism for reading out the reference signal, is not provided in usual cases. The reason for this is that such a mechanism will hinder an improvement in integration density of the magnetoresistive random access memory. In addition, in a case where the magnetization configuration of a memory cell is erroneously reversed, this error can be corrected by an error correction circuit. However, such an error correction circuit is not provided for the reference cell.

Besides, document 3 (Jpn. Pat. Appln. KOKAI Publication No. 2006-210396) discloses that an MTJ element 62R is made to have a desired resistance value by adjusting the area of the MTJ element 62R of a reference cell RC.

BRIEF SUMMARY OF THE INVENTION

According to a first aspect of the present invention, there is provided a magnetoresistive random access memory comprising: a substrate formed of a semiconductor; a first magnetoresistive effect element which is provided above the substrate and takes two steady states with different resistance values by a magnetoresistive effect, a shape of the first magnetoresistive effect element, which is projected on an upper surface of the substrate, having a first length in a first direction and a second length in a second direction, the second length being equal to or greater than the first length, and a ratio of the second length to the first length being a first value; and a second magnetoresistive effect element which is provided above the substrate, is used to determine a resistance state of the first magnetoresistive effect element and takes two steady states with different resistance values by a magnetoresistive effect, a shape of the second magnetoresistive effect element, which is projected on the upper surface of the substrate, having a third length in a third direction and a fourth length in a fourth direction, the fourth length being equal to or greater than the third length, and a ratio of the fourth length to the third length being a second value which is greater than the first value.

According to a second aspect of the present invention, there is provided a magnetoresistive random access memory comprising: a substrate formed of a semiconductor; a first magnetoresistive effect element which is provided above the substrate and takes two steady states with different resistance values by a magnetoresistive effect, a shape of the first magnetoresistive effect element, which is projected on an upper surface of the substrate, being a first ellipsoid or circle with a first minor axis and a first major axis, or a shape including the first ellipsoid or circle, and a ratio of the first major axis to the first minor axis being a first value; and a second magnetoresistive effect element which is provided above the substrate, is used to determine a resistance state of the first magnetoresistive effect element and takes two steady states with different resistance values by a magnetoresistive effect, a shape of the second magnetoresistive effect element, which is projected on the upper surface of the substrate, being a second ellipsoid with a second minor axis and a second major axis, or a shape including the second ellipsoid, and a ratio of the second major axis to the second minor axis being a second value which is greater than the first value.

BRIEF DESCRIPTION OF THE SEVERAL VIEWS OF THE DRAWING

FIG. 1 is a circuit diagram showing a part relating to read of a magnetoresistive random access memory according to an embodiment of the present invention;

FIG. 7A is a cross-sectional view of the magnetoresistive random access memory, taken along line VIIA-VIIA in FIG. 5;

FIG. 7B is a cross-sectional view of the magnetoresistive random access memory, taken along line VIIB-VIIB in FIG. 5;

DETAILED DESCRIPTION OF THE INVENTION

Figure 2:
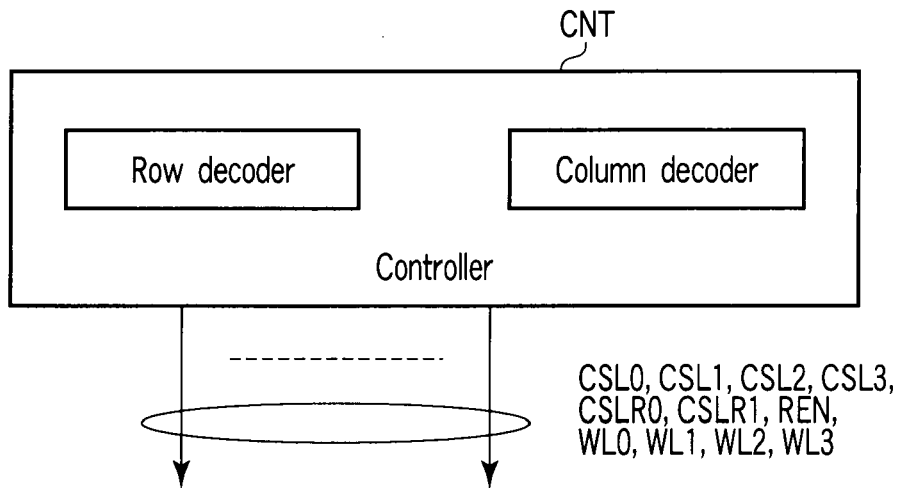
FIG. 2 shows control signals.

Embodiments of the present invention will now be described with reference to the accompanying drawings. In the description below, structural elements having substantially the same functions and structures are denoted by like reference numerals, and an overlapping description is given only where necessary. It should be noted, however, that the drawings are only schematic ones, and the relationship in thickness and plan-view dimensions and the ratios in thickness of respective layers are different from real ones. Thus, specific thicknesses and dimensions should be determined in consideration of the description below. Needless to say, the drawings include parts with different relationships in dimension and parts with different ratios.

The embodiments to be described below exemplify apparatuses and methods for embodying technical concepts of the present invention, and the technical concepts of the invention are not limited to those described below with respect to materials, shapes, structures and dispositions of the structural components. The technical concepts of the present invention may be variously modified within the scope of the patent claims.

Referring now to FIG. 1 to FIG. 12, magnetoresistive random access memories according to embodiments of the invention are described. FIG. 1 is a circuit diagram showing a part relating to read of a main section of a magnetoresistive random access memory according to an embodiment of the invention.

As shown in FIG. 1, a memory cell array is composed of a plurality of memory cells MC and reference cells RC, which are arrayed in a matrix. Each memory cell MC includes a series-connected magnetoresistive effect element (hereinafter referred to as "MR element") MRa, and a select transistor TRa. Each reference cell RC includes a series-connected MR element MRb and a select transistor TRb.

The MR element MRa, MRb is configured to be able to have two steady states by a spin transfer torque writing method, as will be described later in detail. Since the direction of magnetization, and accordingly the resistance value, of the MR element MRb are invariable, as will be described later, the MR element MRb, unlike the MR element of the memory cell MC, is depicted in FIG. 1 as an ordinary resistor, and not as a variable resistor.

The select transistor TRa, TRb is composed of, e.g. a MOSFET (metal oxide semiconductor field effect transistor).

The magnetoresistive random access memory is configured such that a read current is supplied to a desired memory cell MC and a desired reference cell RC, and the resistance state of the memory cell MC can be determined with reference to the resistance state of the reference cell RC. The structure of the magnetoresistive random access memory is not limited to that shown in FIG. 1 if this operation can be realized, and the structure shown in FIG. 1 is merely an example.

As shown in FIG. 1, the memory cells MC are provided in first, second, fifth and sixth columns from the left, and the reference cells RC are provided in third and fourth columns.

In each column, the MR element side end of each memory cell MC belonging to the same column is connected to a first bit line BL1a, and the select transistor side end thereof is connected to a second bit line BL2a. The first bit line BL1a is connected to one end of a MOSFET Q1a which functions as a switching element. The second bit line BL1b is connected to one end of a MOSFET Q2a which functions as a switching element.

In each column, the MR element side end of each reference cell RC belonging to the same column is connected to a first bit line BL1b, and the select transistor side end portion thereof is connected to a second bit line BL2b. The first bit line BL1b is connected to one end of a MOSFET Q1b which functions as a switching element. The second bit line BL2b is connected to one end of a MOSFET Q2b which functions as a switching element.

Column select signals CSL0, CSL1, CSLR0, CSLR1, CSL2 and CSL3 are supplied to the gate terminals of the transistors Q1a and Q1b of the first to sixth columns. Similarly, column select signals CSL0, CSL1, CSLR0, CSLR1, CSL2 and CSL3 are supplied to the gate terminals of the transistors Q2a and Q2b of the first to sixth columns.

The other ends of the transistors Q1a and Q1b of the first to third columns are connected to a common line CLL1. The other ends of the transistors Q2a and Q2b of the first to third columns are connected to a common line CLL2. The other ends of the transistors Q1a and Q1b of the fourth to sixth columns are connected to a common line CLR1. The other ends of the transistors Q2a and Q2b of the fourth to sixth columns are connected to a common line CLR2.

The common line CLL1 is connected to one input terminal of a sense amplifier SA via a MOSFET QRL1 which functions as a switching element. The common line CLR1 is connected to the other input terminal of the sense amplifier SA via a MOSFET QRR1 which functions as a switching element. A read enable signal REN is supplied to the gate terminals of the transistors QRL1 and QRR1. In addition, read current sources RDSL and RDSR are connected to the common lines CLL1 and CLR1.

The common line CLL2 is connected to a common potential node (ground potential node) via a MOSFET QRL2 which functions as a switching element. The common line CLR2 is connected to the common potential node via a MOSFET QRR2 which functions as a switching element. A read enable signal REN is supplied to the gate terminals of the transistors QRL2 and QRR2.

The gate terminals of the switching elements TRa and TRb belonging to a first row are connected to a word line WL0. Similarly, the gate terminals of the switching elements TRa and TRb belonging to an n-th (n: a natural number) row are connected to a word line WLn−1.

As shown in FIG. 2, a controller CNT including a column decoder and a row decoder supplies signals to the word lines WL0 to WL3, column select signals CSL0, CSL1, CSLR0, CSLR1, CSL2 and CSL3 and read enable signal REN.

Figure 3:
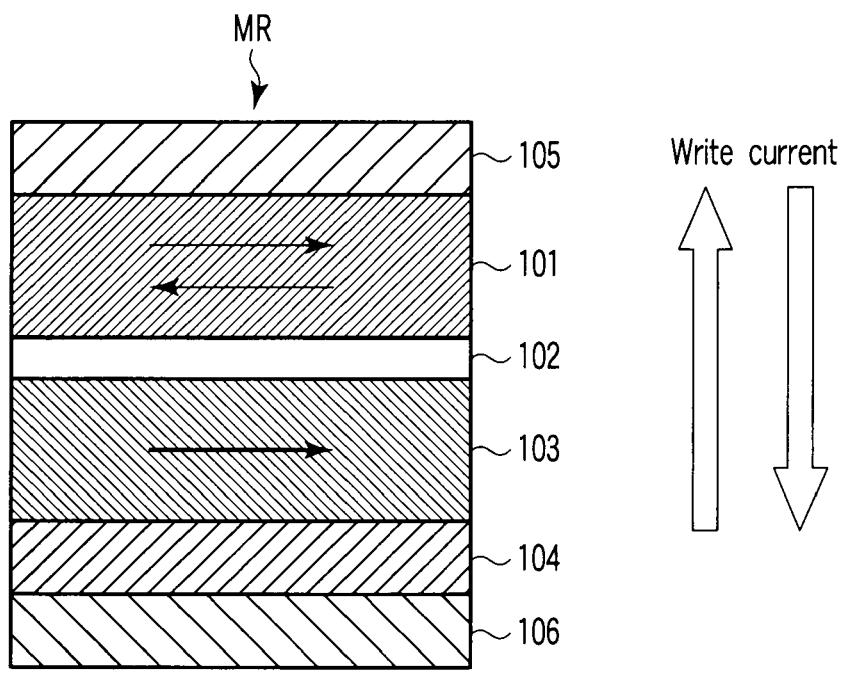
FIG. 3 is a cross-sectional view of a magnetoresistive effect element according to the embodiment.

The MR element MRa, MRb includes, for example, as shown in FIG. 3, at least a fixed layer (magnetization fixed layer) 103 which is formed of a ferromagnetic material, an intermediate layer 102 which is formed of a non-magnetic material, and a free layer (magnetization free layer, magnetization variable layer, recording layer) 101, these layers being stacked successively.

Both (or one) of the free layer 101 and fixed layer 103 may be formed to have a multilayer structure comprising a plurality of sub-layers. The direction of magnetization of the fixed layer 103 is fixed. This is achieved, for example, by providing an antiferromagnetic layer 104 on that surface of the fixed layer 103, which is opposite to the non-magnetic layer.

On the other hand, such a fixing mechanism is not provided for the direction of magnetization of the free layer 101. Accordingly, the direction of magnetization of the free layer 101 is variable. The axis of easy magnetization of the free layer 101 and the direction of magnetization of the fixed layer 103 extend along the mutually opposed planes of the free layer 101, intermediate layer 102 and fixed layer 103. In short, the MR element MR has so-called in-plane magnetization.

A non-magnetic metal, a non-magnetic semiconductor, an insulation film, or the like, may be used for the intermediate layer 102.

Additionally, electrodes 105 and 106 may be provided on that surface of the free layer 101, which is opposite to the non-magnetic layer 102, and on that surface of the antiferromagnetic layer 104, which is opposite to the fixed layer 103.

In order to reverse the direction of magnetization of the free layer 101, which is antiparallel to the direction of magnetization of the fixed layer 103, thereby to make the direction of magnetization of the free layer 101 parallel to the direction of magnetization of the fixed layer 103, an electron current is caused to flow from the fixed layer 103 toward the free layer 101. Conversely, in order to reverse the direction of magnetization of the free layer 101, which is parallel to the direction of magnetization of the fixed layer 103, thereby to make the direction of magnetization of the free layer 101 antiparallel to the direction of magnetization of the fixed layer 103, an electron current is caused to flow from the free layer 101 toward the fixed layer 103.

For example, Co, Fe, Ni or an alloy including such an element is usable as a ferromagnetic material which is used for the free layer 101 and fixed layer 103. For example, Fe—Mn, Pt—Mn, Pt—Cr—Mn, Ni—Mn, Pd—Mn, NiO, $Fe_2O_3$, or a magnetic semiconductor is usable as the material of the antiferromagnetic layer 104.

In the case where a non-magnetic metal is used as the intermediate layer 102, it is possible to use any one of Au, Cu, Cr, Zn, Ga, Nb, Mo, Ru, Pd, Ag, Hf, Ta, W, Pt and Bi, or an alloy including at least one of them. In the case where the intermediate layer 102 is made to function as a tunnel barrier layer, $Al_2O_3$, $SiO_2$, MgO, AlN or the like is usable.

The MR element MR may be formed such that the multilayer structure shown in FIG. 3 is vertically inverted.

Figure 4:
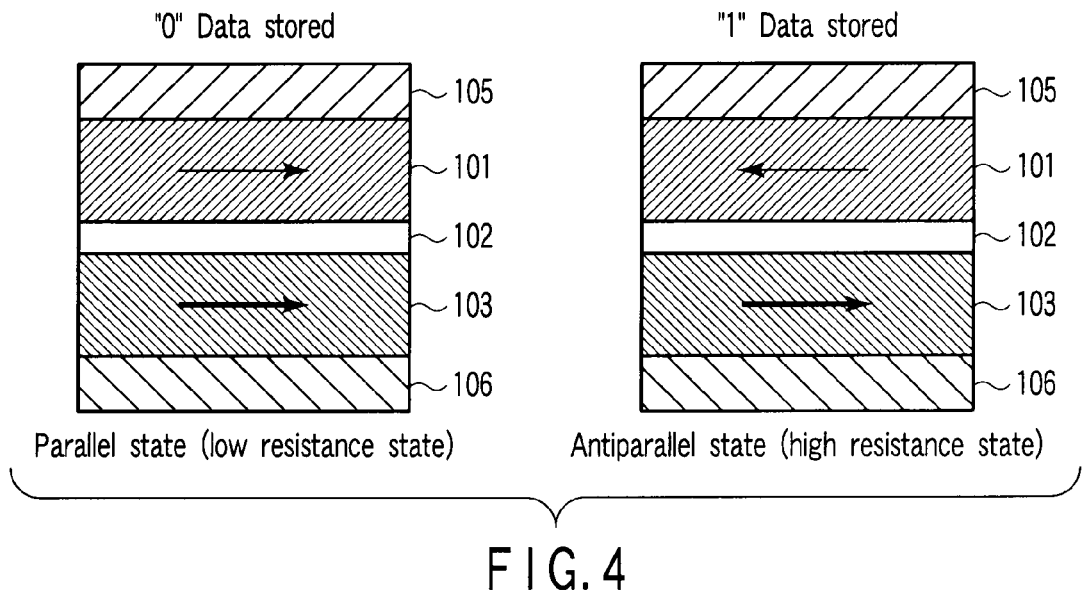
FIG. 4 shows two resistance states of the magnetoresistive effect element.

For example, as shown in FIG. 4, the two resistance states of the MR element MR shown in FIG. 3 are made to correspond to the logic of data stored in the MR element MR. Specifically, the state (low resistance state), in which the direction of magnetization of the fixed layer 103 and the direction of magnetization of the free layer 101 are parallel, is set to be a "0" data storage state, and the state (high resistance state), in which the direction of magnetization of the fixed layer 103 and the direction of magnetization of the free layer 101 are antiparallel, is set to be a "1" data storage state. In FIG. 4, depiction of the antiferromagnetic layer 104 is omitted.

When data is to be read from a memory cell MC between the common lines CLL1 and CLL2 in FIG. 1, the memory cell MC that is an object of data read and the reference cell RC between the common lines CLR1 and CLR2 are selected. On the other hand, when data is to be read from a memory cell MC between the common lines CLR1 and CLR2, the memory cell MC that is an object of data read and the reference cell RC between the common lines CLL1 and CLL2 are selected.

Then, the switching elements QRL1, QRR1, QRL2 and QRR2 are turned on. In addition, the read current source RDSL or RDSR supplies a read current to the memory cell MC that is the object of data read, and to the reference cell RC. The sense amplifier SA compares a voltage due to the read current flowing through the memory cell MC, and a voltage due to the current flowing through the reference cell RC, thereby determining the information which is stored in the memory cell MC that is the object of data read. Alternatively, the sense amplifier SA may execute data read by comparing a read current flowing through a magnetoresistive effect element and a reference value.

In which of the columns the reference cells RC are to be included is not limited to the example shown in FIG. 1. It should suffice if, at least, one set of reference cells RC are provided between the common lines CLL1 and CLL2 and one set of reference cells RC are provided between the common lines CLR1 and CLR2.

The circuit configuration for data write is not limited, if an electric current can arbitrarily be caused to flow in both directions between both ends of a desired memory cell.

Figure 5:
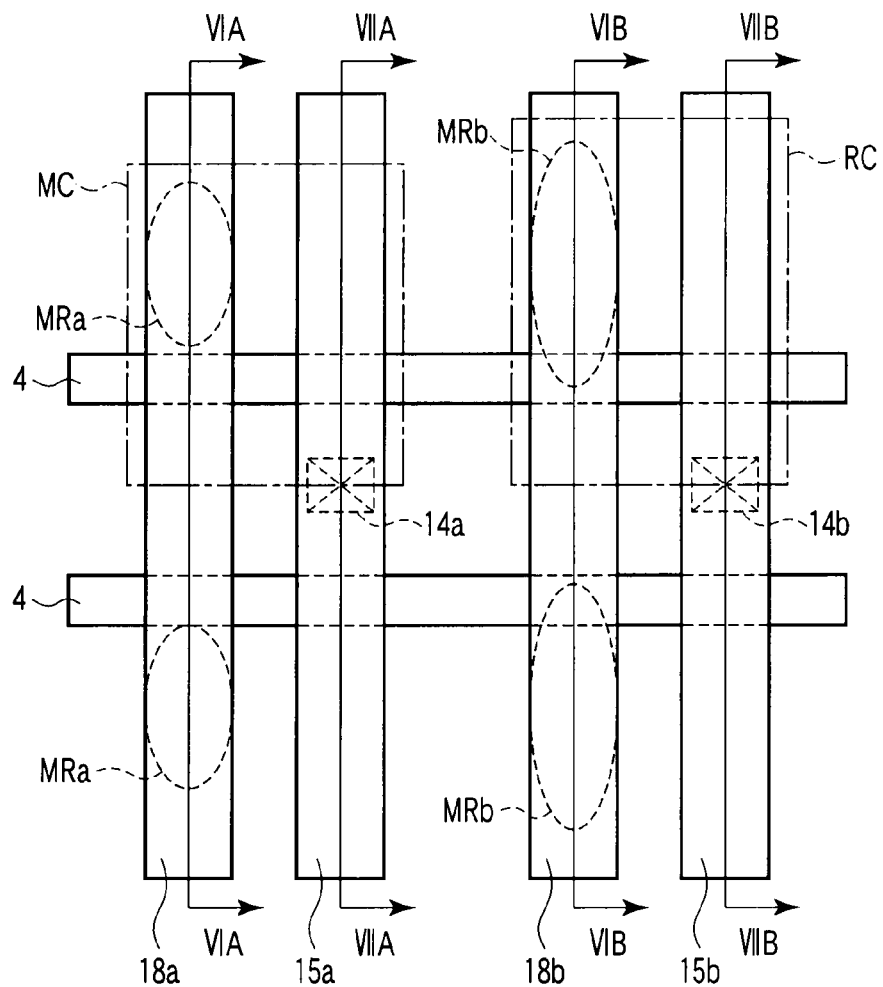
FIG. 5 is a bird's-eye view of a magnetoresistive random access memory according to the embodiment.
Figure 8:
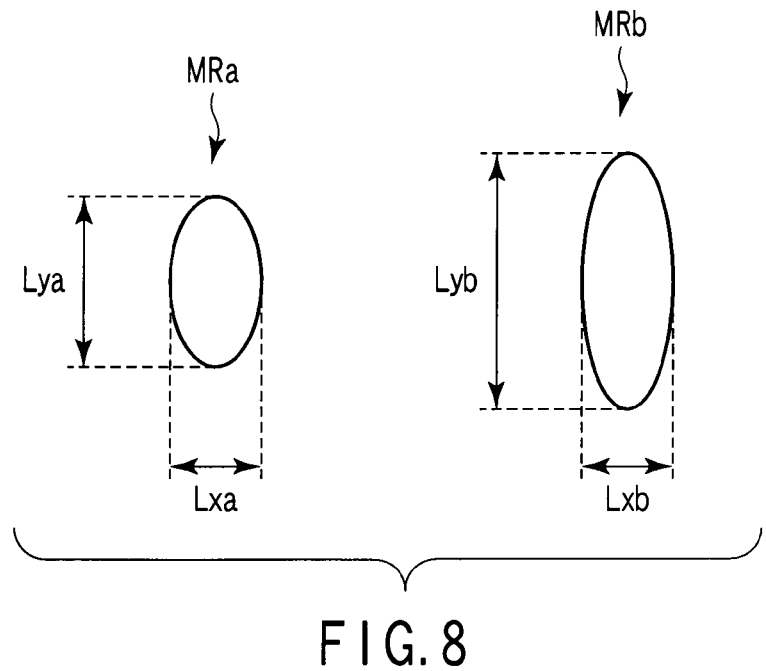
FIG. 8 is a bird's-eye view of MR elements shown in FIG. 5.

Next, referring to FIG. 5 to FIG. 12, a description is given of the structure of the magnetoresistive random access memory according to the embodiment. FIG. 5 is a bird's-eye view of a main part of the magnetoresistive random access memory according to the embodiment, and shows mutually neighboring four memory cells MC and reference cells RC in FIG. 1. FIG. 6A is a cross-sectional view showing a structure, taken along line VIA-VIA in FIG. 5. FIG. 6B is a cross-sectional view showing a structure, taken along line VIB-VIB in FIG. 5. FIG. 7A is a cross-sectional view showing a structure, taken along line VIIA-VIIA in FIG. 5. FIG. 7B is a cross-sectional view showing a structure, taken along line VIIB-VIIB in FIG. 5. FIG. 6A and FIG. 7A show the structure of the memory cells MC, and FIG. 6B and FIG. 7B show the structure of the reference cells RC. FIG. 8 shows, in an extracted manner, only the MR elements MRa and MRb in FIG. 5.

Figures 6A, 6B:
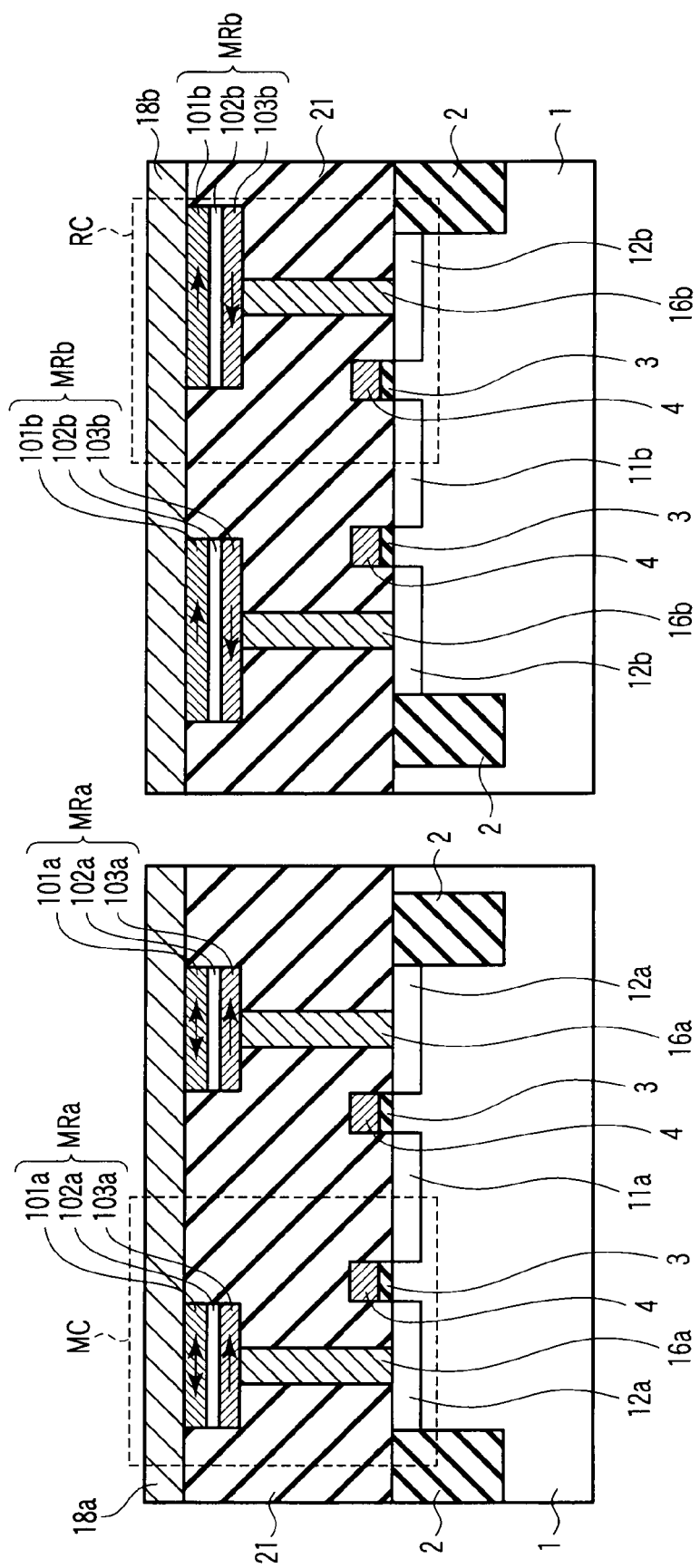
FIG. 6A is a cross-sectional view of the magnetoresistive random access memory, taken along line VIA-VIA in FIG. 5.
FIG. 6B is a cross-sectional view of the magnetoresistive random access memory, taken along line VIB-VIB in FIG. 5.

As shown in FIGS. 5, 6A, 6B, 7A and 7B, insulation films 2 for element isolation are provided in a surface portion of a substrate 1 which is formed of, e.g. silicon. The insulation film 2 has a proper width, surrounds an element region (active region), and has, for example, an STI (shallow trench isolation) structure. In the cross-sectional structures shown in FIGS. 6A, 6B, 7A and 7B, the isolation films 2 are spaced apart from each other. FIGS. 6A and 7A show one element region surrounded by the insulation films 2. Similarly, FIGS. 6B and 7B show one element region surrounded by the insulation films 2.

Gate insulation films 3 are provided on the substrate 1 in the element region. Gate electrodes 4 are provided on the gate insulation films 3. The gate electrodes 4 are disposed along the row direction (right-and-left direction in FIG. 5), and are mutually spaced apart in the column direction (up-and-down direction in FIG. 5). The gate electrodes 4 function as the word lines WL0 to WLn in FIG. 1.

In the surface region of the substrate 1, an impurity diffusion region 11a, which functions as a source/drain region, is formed in the memory cell section (FIGS. 6A and 7B) between the gate electrodes 4. In the reference cell section (FIGS. 6B and 7B), an impurity diffusion region 11b, which functions as a source/drain region, is formed. The impurity diffusion region 11a extends from the cross section of FIG. 6A to the cross section of FIG. 7A, and the impurity diffusion region 11b extends from the cross section of FIG. 6B to the cross section of FIG. 7B.

In the surface region of the substrate 1, an impurity diffusion region 12a, which functions as a source/drain region, is formed on that side of each gate electrode 4, which is opposite to the impurity diffusion region 11a. The impurity diffusion region 11a and the impurity diffusion region 12a are spaced apart under the gate electrode 4. In the surface region of the substrate 1, an impurity diffusion region 12b, which functions as a source/drain region, is formed on that side of each gate electrode 4, which is opposite to the impurity diffusion region 11b. The impurity diffusion region 11b and the impurity diffusion region 12b are spaced apart under the gate electrode 4. The gate electrode 4 and impurity diffusion regions 11a and 12a constitute a MOSFET that functions as the select transistor TRa. The gate electrode 4 and impurity diffusion regions 11b and 12b constitute a MOSFET that functions as the select transistor TRb.

Contact plugs 14a and 14b, which are formed of an electrically conductive material, are provided on the impurity diffusion region 11a and impurity diffusion region 11b, respectively. Signal lines (wiring lines) 15a and 15b, which are formed of an electrically conductive material, are provided on the contact plugs 14a and 14b. The signal lines 15a and 15b extend in the column direction (up-and-down direction in FIG. 5), and are spaced apart in the row direction (right-and-left direction in FIG. 5). The signal lines 15a and 15b function as the first and second bit lines BL2a and BL2b. The signal lines 15a and 15b are formed of a first wiring layer (M1 layer).

Contact plugs 16a and 16b, which are formed of an electrically conductive material, are provided on the impurity diffusion regions 12a and impurity diffusion layers 12b.

MR elements MRa and MRb are provided on the contact plugs 16a and 16b. In FIGS. 6A and 6B, for the purpose of simplicity, only the free layer 101 (101a, 101b), intermediate layer 102 (102a, 102b) and fixed layer 103 (103a, 103b) of the MR element MRa, MRb are shown, and depiction of the electrodes 105, 106, etc. is omitted.

The MR elements MRa and MRb are formed by the same fabrication steps. Thus, the free layers 101a and 101b, which are structural parts of the MR elements MRa and MRb, have the same characteristics including thickness and material, except that their shapes projected on the upper surface of the substrate 1 (hereinafter referred to as "plan-view shapes") are different. Similarly, the intermediate layers 102a and 102b, as well as the fixed layers 103a and 103b, have the same characteristics including thickness and material, except that their plan-view shapes are different.

As has been described above, each of the MR elements MRa and MRb is composed of a plurality of layers, and the respective layers have, in usual cases, the same plan-view shape. Thus, it is assumed that when the term "plan-view shape" of the MR element MRa, MRb is mentioned, the "plan-view shape" comprehensively refers to the plan-view shapes of the respective layers of the MR element MRa, MRb.

The plan-view shapes of the MR elements MRa and MRb have different aspect ratios (the ratio of the horizontal dimension to the vertical dimension of the plan-view shape), as will be described below.

As regards the MR element MRa, it is necessary that the magnetization of the free layer 101a be reversed by a small write current and, at the same time, that information stored in the MR element MRa be prevented from being inverted due to external disturbance. As regards the MR element in which information is written by spin injection, the reversal of the magnetization of the free layer is easier as the plan-view shape is smaller, and therefore the plan-view shape is set so as to meet these requirements. A specific example is as follows.

As shown in FIG. 5 and FIG. 8, the plan-view shape of the MR element MRa is elliptic. The length Lxa in the right-and-left direction of the MR element MRa (corresponding to the minor axis of the ellipsoid) is, for example, equal to the length in the right-and-left direction of the signal line 18a. This specification in length is adopted for the ease in control in the processing of the MR element MRa, and is not indispensable. The length Lya in the up-and-down direction of the MR element MRa (corresponding to the major axis of the ellipsoid) is, for example, double the length Lxa. The direction of easy magnetization of the free layer 101a of the MR element MRa agrees with the direction of the length Lya, and the direction of magnetization of the fixed layer 103a also agrees with the direction of the length Lya.

On the other hand, it is required that the magnetization of the free layer 101b of the MR element MRb is not reversed. Thus, in order to make hard the reversal of magnetization of the free layer 101b, the plan-view shape of the free layer 101b has a greater aspect ratio than the MR element MRa. A specific example is as follows. The plan-view shape of the MR element MRb is elliptic. The length Lxb in the right-and-left direction of the MR element MRb (corresponding to the minor axis of the ellipsoid) is, for example, equal to the length in the right-and-left direction of the signal line 18b. In a typical example, the signal lines 18a and 18b have an equal length in the right-and-left direction. Accordingly, in the typical example, the length Lxa is equal to the length Lxb. On the other hand, the length Lyb in the up-and-down direction of the MR element MRb (corresponding to the major axis of the ellipsoid) is, for example, three times greater than the length Lxb, that is, for example, three times greater than the length Lxa. By setting this aspect ratio, the shape magnetic anisotropy of the free layer 101b is enhanced, and the magnetization of the free layer 101b becomes hard to reverse.

In usual cases, the length Lxa and the length Lxb are equal, and the length Lyb is about 1.5 times greater than the length Lya. Thus, the area of the plan-view shape of the MR element MRb is greater than the area of the plan-view shape of the MR element MRa. Since the MR element MRa is configured to have such a shape that the magnetization configuration of the MR element MRa, as an information recording carrier, is reversed by the write current, as described above, the magnetization configuration of the MR element MRb, which has a larger plan-view shape than the MR element MRa, is less easily reversed than in the MR element MRa.

In the Figures, the plan-view shape of the MR element MRa, MRb is elliptic, but the plan-view shape is not limited to this example. Specifically, it should suffice if the plan-view shape of the MR element MRa, MRb is elongated as a whole in a predetermined direction, and the aspect ratio, which is defined by the ratio of the length in the predetermined direction to the length in a direction crossing the predetermined direction (typically, a direction perpendicular to the predetermined direction), is greater in the MR element MRb than in the MR element MRa. In other words, it should suffice if the aspect ratio of the plan-view shape of the MR element MRa, MRb, which is defined by the ratio of the length along the axis of easy magnetization to the length along the axis of hard magnetization, is greater in the MR element MRb than in the MR element MRa. For example, the plan-view shape of the MR element MRa, MRb is not limited to the ellipsoid, and may be various shapes including the ellipsoid. Specific examples are a rectangle, and an elliptic or rectangular shape with projections or notches.

Besides, the long sides of the MR element MRa, MRb may be disposed in mutually different directions, and the short sides of the MR element MRa, MRb may be disposed in mutually different directions.

Figure 9:
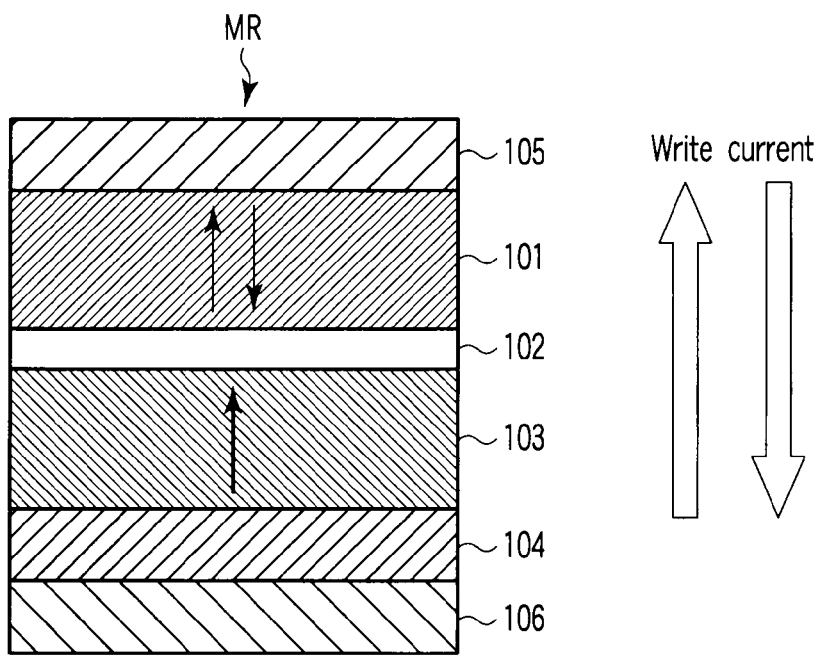
FIG. 9 is a cross-sectional view of a magnetoresistive effect element according to another embodiment of the invention.

In the above description, the directions of magnetization of the free layer 101 and fixed layer 103 are, by way of example, along the mutually opposed planes of layers of the MR element MR. However, the present embodiment is not limited to this example, and the directions of magnetization of the free layer 101 and fixed layer 103 may be, as shown in FIG. 9, along directions passing through the layers of the MR element MR. In short, the MR element MR may have so-called perpendicular magnetization. The axis of easy magnetization of the free layer 101 and the direction of magnetization of the fixed layer 103 are perpendicular to the mutually opposed planes of the free layer 101, intermediate layer 102 and fixed layer 103.

Figure 10:
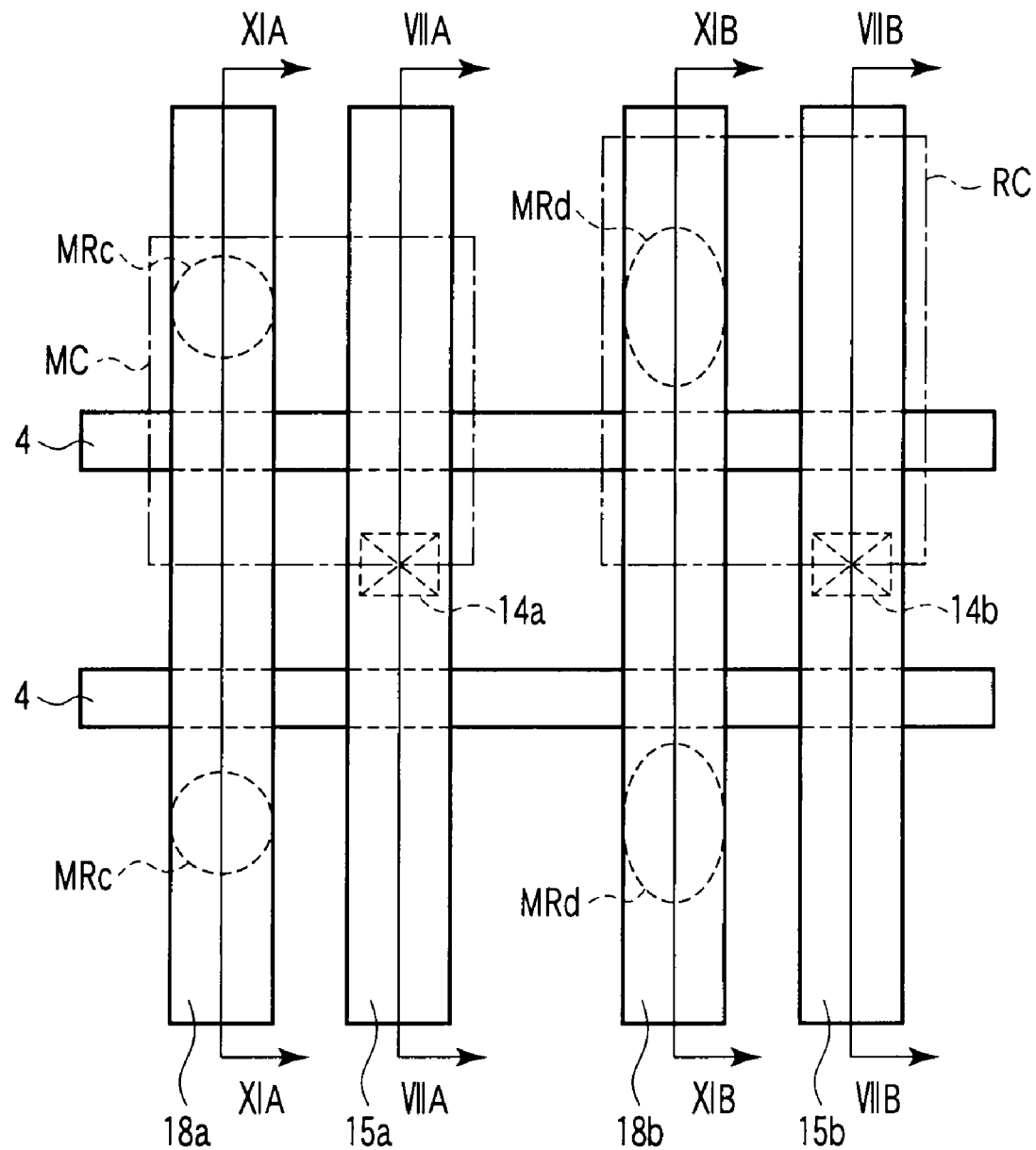
FIG. 10 is a bird's-eye view of a magnetoresistive random access memory according to another embodiment of the invention.
Figures 11A, 11B:
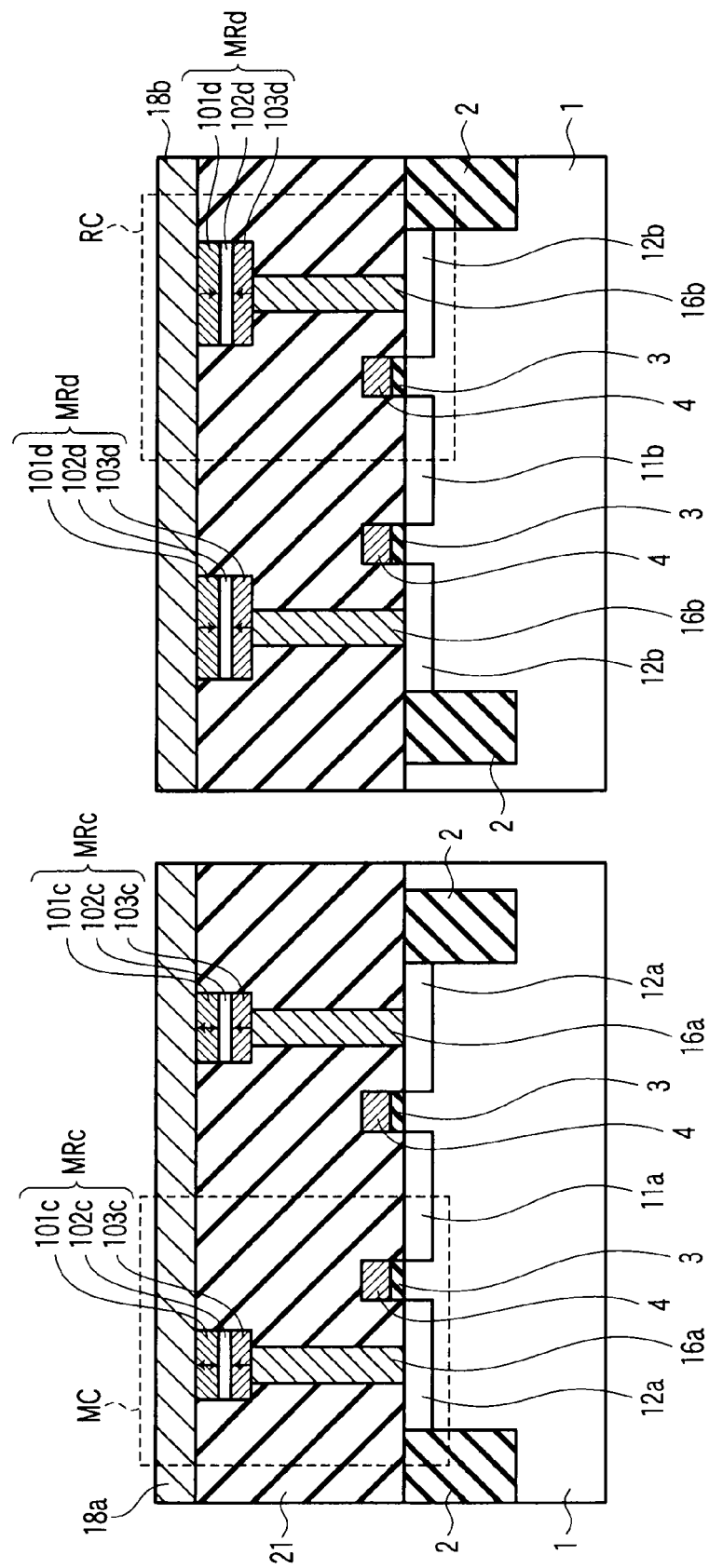
FIG. 11A is a cross-sectional view of the magnetoresistive random access memory, taken along line XIA-XIA in FIG. 10.
FIG. 11B is a cross-sectional view of the magnetoresistive random access memory, taken along line XIB-XIB in FIG. 10.
Figure 12:
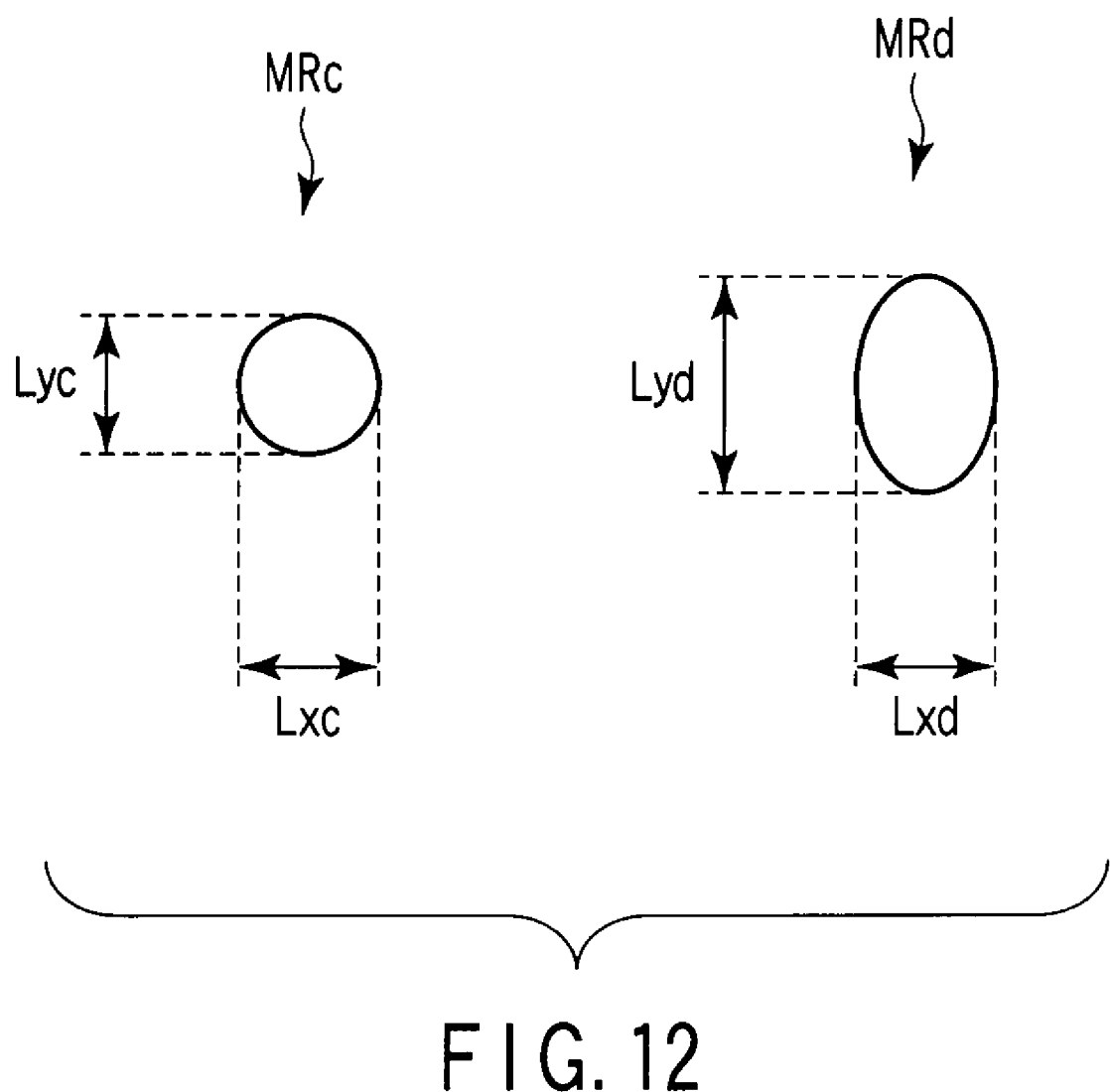
FIG. 12 is a bird's-eye view of MR elements shown in FIG. 10.

FIG. 10 is a bird's-eye view of a main part of a magnetoresistive random access memory according to another embodiment, and shows mutually neighboring four memory cells MC and reference cells RC in FIG. 1. FIG. 11A is a cross-sectional view showing a structure, taken along line XIA-XIA in FIG. 10. FIG. 11B is a cross-sectional view showing a structure, taken along line XIB-XIB in FIG. 10. The structure along line VIIA-VIIA and the structure along line VIIB-VIIB in FIG. 10 are the same as shown in FIGS. 7A and 7B. FIG. 12 shows, in an extracted manner, only the MR elements MRa and MRb in FIG. 10.

As shown in FIG. 10 to FIG. 12, as the MR elements of the memory cells MC, MR elements MRc are provided in place of the MR elements MRa. In addition, as the MR elements of the reference cells RC, MR elements MRd are provided in place of the MR elements MRb.

In FIG. 11, only the free layer 101 (101c, 101d), intermediate layer 102 (102c, 102d) and fixed layer 103 (103c, 103d) of the MR element MRc, MRd are shown, and depiction of electrodes 105, 106, etc. is omitted.

The MR elements MRc and MRd are formed by the same fabrication steps. Thus, the free layers 101c and 101d have the same characteristics including thickness and material, except that their plan-view shapes are different. Similarly, the intermediate layers 102c and 102d, as well as the fixed layers 103c and 103d, have the same characteristics including thickness and material, except that their plan-view shapes are different.

From the standpoint of easier processing, the length Lxc of the MR element MRc in the right-and-left direction in FIG. 12 is equal to, for example, the length of the signal line 18a in the right-and-left direction. In addition, the length Lyc of the MR element MRc in the up-and-down direction in FIG. 12 is equal to the length Lxc. Accordingly, the plan-view shape of the MR element MRc is circular. Needless to say, the plan-view shape of the MR element MRc may be elliptic.

The plan-view shape of the MR element MRd is elliptic. The length Lxd of the MR element MRd in the right-and-left direction in FIG. 12 (corresponding to the minor axis of the ellipsoid) is, for example, equal to the length in the right-and-left direction of the signal line 18b. In a typical example, the length Lxc is equal to the length Lxd. On the other hand, the length Lyd of the MR element MRd in the up-and-down direction in FIG. 12 (corresponding to the major axis of the ellipsoid) is, for example, 1.5 times greater than the length Lxd. By setting this aspect ratio, the magnetization of the free layer 101d becomes hard to reverse.

In this embodiment, too, the plan-view shape of the MR element MRc, MRd is not limited to the ellipsoid or circle, and may be various shapes including the ellipsoid, such as a rectangle, and an elliptic or rectangular shape with projections or notches.

According to the magnetoresistive random access memories relating to the embodiments of the invention, the aspect ratio of the plan-view shape of the MR element MRb, MRd of the reference cell RC is greater than the aspect ratio of the plan-view shape of the MR element MRa, MRc of the memory cell MC. Thus, the magnetization configuration is less easily reversed in the MR element MRb, MRd than in the MR element MRa, MRc, and the MR element MRb, MRd has high stability. Therefore, a magnetoresistive random access memory with high reliability can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive random access memory comprising:
a substrate formed of a semiconductor;

a first magnetoresistive effect element which is provided above the substrate and takes two steady states with different resistance values by a magnetoresistive effect, a shape of the first magnetoresistive effect element, which is projected on an upper surface of the substrate, comprising a first ellipse with a first minor axis and a first major axis, and a ratio of the first major axis to the first minor axis being a first value; and a second magnetoresistive effect element which is provided above the substrate, is used to determine a resistance state of the first magnetoresistive effect element and takes two steady states with different resistance values by a magnetoresistive effect, a shape of the second magnetoresistive effect element, which is projected on the upper surface of the substrate, comprising a second ellipse with a second minor axis and a second major axis, and a ratio of the second major axis to the second minor axis being a second value which is greater than the first value, a sense amplifier which has a first input terminal and a second input terminal and amplifies a difference between a voltage or a current of the first input terminal and a voltage or a current of the second input terminal, wherein when information, which is stored in the first magnetoresistive effect element, is read, one end of the first magnetoresistive effect element is electrically connected to the first input terminal, and one end of the second magnetoresistive effect element is electrically connected to the second input terminal, a first wiring line connected between said one end of the first magnetoresistive effect element and the first input terminal;

a second wiring line connected between said one end of the second magnetoresistive effect element and the second input terminal;

a first current source which supplies a read current to the first wiring line; and a second current source which supplies a read current to the second wiring line, wherein a width of the first ellipse along the first minor axis is equal to a width of the first wiring line, and a width of the second ellipse along the second minor axis is equal to a width of the second wiring line.

2. The memory according to claim 1, wherein the first magnetoresistive effect element includes a first free layer having a variable direction of magnetization, a first fixed layer having a fixed direction of magnetization, and a first intermediate layer which is formed of a non-magnetic material interposed between the first free layer and the first fixed layer, and the second magnetoresistive effect element includes a second free layer having a variable direction of magnetization, a second fixed layer having a fixed direction of magnetization, and a second intermediate layer which is formed of a non-magnetic material interposed between the second free layer and the second fixed layer.

3. The memory according to claim 2, wherein an axis of easy magnetization of the first free layer and a direction of magnetization of the first fixed layer are along the first major axis of the first ellipse, an axis of hard magnetization of the first free layer is along the first minor axis of the first ellipse, an axis of easy magnetization of the second free layer and a direction of magnetization of the second fixed layer are along the second major axis of the second ellipse, and an axis of hard magnetization of the second free layer is along the second minor axis of the second ellipse.

4. The memory according to claim 2, wherein an axis of easy magnetization of the first free layer and a direction of magnetization of the first fixed layer are along a direction perpendicular to a film surface, and an axis of easy magnetization of the second free layer and a direction of magnetization of the second fixed layer are along a direction perpendicular to a film surface.

5. The memory according to claim 1, further comprising:

a first select transistor which is provided on the substrate and is connected to the other end of the first magnetoresistive effect element; and a second select transistor which is provided on the substrate and is connected to the other end of the second magnetoresistive effect element.

6. The memory according to claim 2, wherein each of the first magnetoresistive effect element and the second magnetoresistive effect element includes a first electrode and a second electrode which sandwich the first or second free layer, the first or second fixed layer, and the first or second intermediate layer.

7. The memory according to claim 1, wherein the second value is 1.5 times greater than the first value.

* * * * *